United States Patent [19]

Nixdorf et al.

[11] Patent Number: 4,888,084

[45] Date of Patent: Dec. 19, 1989

[54] METHOD FOR THE PREPARATION OF TITANIUM NITRIDE WHISKERS

[75] Inventors: Richard D. Nixdorf, Knoxville; Mary H. Rawlins, Oak Ridge, both of Tenn.

[73] Assignee: American Matrix, Inc., Knoxville, Tenn.

[21] Appl. No.: 261,375

[22] Filed: Oct. 24, 1988

[51] Int. Cl.[4] .......................... C30B 1/10; C30B 29/38
[52] U.S. Cl. ..................................... 156/600; 156/603; 156/DIG. 75; 156/DIG. 99; 156/DIG. 112; 423/411; 501/95
[58] Field of Search ............... 136/600, 603, DIG. 75, 136/DIG. 99, DIG. 112; 423/81, 411; 501/95, 96

[56] References Cited

U.S. PATENT DOCUMENTS

| | | | |
|---|---|---|---|
| 957,842 | 5/1910 | Bosch | 423/411 |
| 1,391,147 | 9/1921 | Bichowsky et al. | 423/411 |
| 2,461,018 | 2/1949 | Alexander | 423/411 |
| 3,226,193 | 12/1965 | Dolloff | 423/411 |
| 3,657,089 | 4/1972 | Takahashi et al. | 501/95 |
| 4,341,965 | 7/1982 | Okuo et al. | 310/11 |
| 4,460,697 | 7/1984 | Hara et al. | 423/411 |
| 4,543,345 | 9/1985 | Wei | 501/95 |
| 4,595,545 | 6/1986 | Sane | 423/411 |
| 4,756,791 | 7/1988 | D'Angelo et al. | 156/DIG. 99 |

FOREIGN PATENT DOCUMENTS 662779   5/1963   Canada .............................. 423/411

OTHER PUBLICATIONS

Kato, "Some Common Aspects of the Growth of TiO, ZrN, TiC and ZrC Whiskers in C.V.D.", Journal of Crystal Growth 49(1980) pp. 199 to 203.

*Primary Examiner*—John Doll
*Assistant Examiner*—Robert M. Kunemund
*Attorney, Agent, or Firm*—Pitts and Brittian

[57] ABSTRACT

A process for the manufacture of single crystal titanium nitride whiskers having uniform diameters and lengths suitable for use in the reinforcing of many matrix materials. The process is carried out by rapidly heating a mixture of titanium dioxide, fibrous carbon and a catalyst selected from individual combinations of cobalt, nickel, magnesium and calcium, for example. This mixture of solids is maintained in a closed container and is rapidly heated to a temperature of about $1300 \pm 100$ degrees C. for about 1 hour. During this heating a halogen, preferably a chlorine-containing gas, in conjunction with nitrogen is passed into the container whereby the titanium dioxide is converted to titanium nitride in the form of single crystal whiskers. These whiskers have a uniform diameter of about 0.5 to about 1 micron and average lengths of about 30–60 microns. The exterior surface is particularly amenable to bonding to the matrix material to which these whiskers are added for strength.

15 Claims, No Drawings

METHOD FOR THE PREPARATION OF TITANIUM NITRIDE WHISKERS

DESCRIPTION

1. Technical Field

This invention relates generally to methods for the preparation of whiskers for use in reinforcing various ceramic and metallic structures, and more particularly to a method for the preparation of titanium nitride whiskers for this and other uses.

2. Background Art

Various forms of fiber-like and whisker-like elements are conventionally utilized for adding strength to ceramic and metallic components. In particular, whiskers utilized for these applications have diameters from about 0.1 to about 3.0 microns and lengths from about 5.0 to about 200 microns. One of the most commonly used whisker structures is SiC. This is typically discussed in, for example, U.S. Pat. No. 4,543,345, issued to G. C. Wei on Sept. 24, 1985. A considerable number of other references discuss these fibers, and many of these are referenced in this particular patent.

Although SiC whiskers have been utilized for the reinforcing of many types of matrix materials, there are some applications for reinforcing where the SiC may not be completely compatible with the matrix material. Thus, other fiber and whisker compositions are often substituted to achieve a particular strengthening of a ceramic or metallic matrix. These additional fibers, or whiskers, are derived from several metals in the form of carbides, oxides, nitrides and borides. Included in this list of additional fibrous materials are, for example, silicon nitride, magnesium oxide, alumina, zirconia, titanium carbide, tungsten carbide, titanium nitride and aluminum nitride. These are discussed, for example, in U.S. Pat. No. 4,341,965, issued to T. Okuo, et al. on July 27, 1982, and in various references cited therein.

A problem that exists in the use of titanium nitride whiskers, which is common to several of the whisker compositions, is that processes for preparing the same are generally time consuming and the product produced thereby is non-uniform in both diameter and length. One of the problems associated with whiskers having a wide variety of sizes is that concerned with obtaining uniform dispersion of the whisker in the base composite so as to achieve uniform physical properties throughout. In addition, very small whiskers give rise to potential health problems. Another problem that exists with many of the whiskers is that of obtaining a surface texture to which the matrix material can be joined such that bonding effects a maximum improvement in strength.

Accordingly, it is an object of the present invention to provide a process for the manufacture of titanium nitride single crystal whiskers such that the product produced thereby has a very uniform size distribution.

It is another object of the present invention to provide a process for the production of single crystal titanium nitride whiskers whereby the whiskers are produced rapidly such that the process is efficient in the production of the desired whiskers.

It is still another object of the present invention to provide a process for the production of single crystal titanium nitride whiskers wherein the external surfaces thereof are compatible with the requirements of the various ceramic and metal matrix composites so as to enhance bonding to the matrix material containing the same.

These and other objects of the present invention will become apparent upon a consideration of the following detailed description.

DISCLOSURE OF THE INVENTION

In accordance with the present invention, titanium dioxide powder and carbon fibers are intimately mixed with one or more selected catalysts, with this mixture subjected to a gaseous halogen whereby the improved titanium nitride whiskers are produced. The temperature for the reaction is in the range of 1200-1400 degrees C. and the reaction time is approximately one hour. Suitable catalysts include cobalt, magnesium and nickel as powdered metals or in crystalline compound form. Halogenation gases are typically selected from gaseous HCl or chlorine gas.

BEST MODE FOR CARRYING OUT THE INVENTION

Single crystal titanium nitride (TiN) whiskers have been produced from the high temperature furnacing of solid reactants, including a catalyst, with gaseous reactants according to the following general equation:

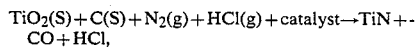

$$TiO_2(S) + C(S) + N_2(g) + HCl(g) + catalyst \rightarrow TiN + CO + HCl,$$

where (S) and (g) are the conventional designations for solid and gas, respectively.

Finely powdered $TiO_2$ being about 80–85 wt % of the mixtures is mixed with carbonized organic fibers being 12 to 13 wt % of the mixture and with 1–20% a more preferably between 2 to 5 wt % of the mixture powder metal or metal compound catalyst. This mixture is enclosed in a graphite container which is fitted with a gas inlet tube for introducing a controlled flow of about 0.4 to about 2 scfh of the gaseous reactants. The mixture is rapidly heated in approximately 5 minutes to about 1300±100 degrees C. and held at this temperature for approximately 1 hour. During this time, the $TiO_2$ (titanium dioxide) is chemically reduced, halogenated and subsequently nitrided at a rate and temperature conducive to the synthesis of single crystal titanium nitride whiskers. In the course of the reaction to form the titanium nitride whiskers, the carbonized organic (e.g., cotton) fibers perform at least three functions: (1) provide a high void volume necessary for whisker growth; (2) act as a reducing agent for the titanium dioxide; and (3) act as a nucleation site for whisker growth. The role of the cobalt, or corresponding powders which perform as catalysts, more precisely is as an alloying agent to form combinations of a catalyst with the titanium and nitrogen which further serve as nuclei from which the whiskers grow.

The following examples are typical of the method for producing the titanium nitride whiskers according to the present invention.

EXAMPLE 1

Approximately 80 g of dry $TiO_2$, having a particle size of about 0.9 to about 2.5 microns, was intimately mixed with carbonized cotton fibers. Although various carbonized cotton fibers can be used, the particular fibers utilized in this example are those identified as PFX fibers available from American Matrix, Inc., Knoxville, Tenn. Approximately 12 g of these fibers were utilized. In addition, approximately 2 g of cobalt metal powder was added while these materials were being intimately blended as using a "V-blender". This mixture was then placed in an enclosed graphite container fitted with a gas inlet tube. Nitrogen gas was bubbled through muriatic acid (HCl) maintained at a temperature of about 70–90 degrees C. at a flow rate of between 0.2 and 4 scfh so as to introduce into the graphite container a halogenation atmosphere. Furthermore, a nitrogen purge gas was passed through the furnace during the reaction time at a rate of 0.2 to 4 scfh. The furnace containing the graphite container was heated rapidly, e.g., in less than 5 minutes, held at a processing temperature for approximately 1 hour at 1300±100 degrees C. The resultant whiskers produced in this process had an average diameter of 0.5 microns and an average length of 20–60 microns. The whiskers had a rapid growth rate of approximately $1 \times 10^{-4}$ cm/s and had a preferred growth direction of <100>. The whiskers had a generally square cross-section with sides of the cube being <110>. Planes with distinctly periodic serrations along the surfaces, which were approximately 200 nm, apart formed by a growth in the <111> direction. Whiskers exhibited a complete lack of dendritic growth.

EXAMPLE 2

Titanium nitride whiskers were prepared utilizing the steps indicated in Example 1, except that chlorine gas was substituted for the hydrochloric gas. Thus, nitrogen was not needed to be bubbled through hot muriatic acid. The flow rate of the chlorine gas in this example was in the range of about 0.2 to 1.0 scfh. The resultant whiskers had substantially the same properties as those produced utilizing the HCl.

In addition to the use of cobalt metal powder in this process, other catalyst materials such as nickel, magnesium and possibly calcium can be used. Furthermore, it has been shown that these do not necessarily need to be in metallic form, but can be in compounds which are easily thermally decomposed and result in the presence of these metal ions in the mixture. Furthermore, they can be mixed metals and metal compounds chosen from these specific catalyst combinations. The catalyst material is normally blended with the titanium oxide prior to the addition of the carbon fibers. The resultant titanium nitride whiskers have a size and a surface condition that is highly conducive for their use as reinforcing materials in a wide number of matrix materials, including metals, ceramics, plastics and the like.

From the foregoing, it will be understood by those versed in the art that a process has been developed for the manufacture of uniformly sized titanium nitride whiskers. This process is carried out quickly and efficiently with a resultant high yield of the product. Although limited examples are given of the conditions for manufacture of the titanium nitride whiskers, these are not given for the purposes of limitation but, rather, as being illustrative of the process. The invention is to be limited only by the appended claims and their equivalents when taken together with the detailed description thereof.

I claim:

1. A method for the preparation of uniform single crystal titanium nitride whiskers, comprising the steps:
    intimately mixing finely divided titanium dioxide powder, carbonized organic fibers and a finely powdered catalyst material selected from metals and compounds having at least one metallic ion selected from cobalt, nickel, magnesium and calcium;
    placing said mixture of titanium dioxide, powdered catalyst and carbonized fibers in a closed graphite container, said container provided with a gas inlet;
    heating said graphite container in a non-oxidizing atmosphere at about 1300±100 degrees C. for about one hour;
    during said heating step, introducing nitrogen gas and a halogen gas into said container through said gas inlet; and
    cooling said container and recovering said single crystal titanium nitride whiskers from said container.

2. The method of claim 1 wherein said halogen gas is gaseous HCl, and said gaseous HCl and said nitrogen gas are flowed into said container at about 0.2 to about 4 scfh.

3. The method of claim 2 wherein said gaseous HCl is obtained by flowing an inert gas through muriatic acid maintained at about 70–90 degrees C.

4. The method of claim 3 wherein said inert gas is nitrogen flowing at about 0.2 to about 4 scfh.

5. The method of claim 1 wherein said catalyst is at least one metal selected from cobalt, nickel and magnesium.

6. The method of claim 1 wherein said catalyst is at least one compound selected from thermally decomposable compounds and mixtures of compounds resulting in ions of metals selected from cobalt, nickel, magnesium and mixtures thereof.

7. The method of claim 1 wherein said titanium powder has a particle size of about 0.9 to about 2.5 microns.

8. The method of claim 1 wherein said halogen gas is chlorine gas at a flow rate of about 0.2 to about 1.0 scfh.

9. The method of claim 1 wherein said titanium dioxide powder is about 85 wt % of the total mixture, said catalyst powder is about 2 wt % of the total mixture, and said carbonized organic fiber is about 13 wt % of said mixture.

10. A method for the preparation of uniform single crystal titanium nitride whiskers, comprising the steps:
    mixing titanium dioxide powder having a particle size of about 0.9 to about 2.5 microns with a finely divided powder catalyst selected from metals, thermally decomposable metal compounds and mixtures thereof to provide ions of at least one metallic species selected from cobalt, nickel and magnesium;
    intimately mixing said mixed titanium dioxide powder and said catalyst with carbonized organic fibers, said titanium dioxide being about 80–85 wt % of said mixture, said catalyst powder being about 2–5 wt % of said mixture, and said carbonized organic fiber being about 12–13 wt % of said mixture;
    placing said mixture of said titanium dioxide powder, said catalyst powder and said carbonized organic fibers in an enclosed graphite container, said container provided with a gas inlet;
    heating said container in an inert atmosphere to a temperature of about 1300±100 degrees C. for about one hour;
    during said heating step, introducing nitrogen gas and a chlorine-containing gas into said container through said inlet, each at a rate of about 0.2 to about 2.0 scfh; and cooling said container and recovering said titanium nitride whiskers from said container.

11. The method of claim 10 wherein said chlorine-containing gas is gaseous HCl, and said gaseous HCl and said nitrogen gas are flowed into said container at about 0.2 to about 4 scfh.

12. The method of claim 10 wherein said gaseous HCl is obtained by flowing an inert gas through muriatic acid maintained at about 70-90 degrees C.

13. The method of claim 12 wherein said inert gas is nitrogen flowing at about 0.2 to about 4 scfh.

14. The method of claim 10 wherein said chlorine-containing gas is chlorine gas at a flow rate of about 0.2 to about 1.0 scfh.

15. A method for the preparation of uniform single crystal titanium nitride whiskers, comprising the steps:
mixing titanium dioxide powder having a particle size of about 0.9 to about 2.5 microns with finely divided cobalt metal catalyst;
intimately mixing said titanium dioxide powder and said catalyst with carbonized organic fibers, said titanium dioxide being about 80-85 wt % of said mixture, said catalyst powder being about 2-5 wt % of said mixture, and said carbonized organic fiber being about 12-13 wt % of said mixture;
placing said mixture of said titanium dioxide powder, said catalyst powder and said carbonized organic fibers in an enclosed graphite container, said container provided with a gas inlet;
heating said container in an inert atmosphere to a temperature of about 1300±100 degrees C. for about one hour;
during said heating step, introducing nitrogen gas and gaseous HCl into said container through said inlet, each at a rate of about 0.2 to about 2.0 schf, said gaseous HCl obtained by flowing an inert gas through muriatic acid maintained at about 70-90 degrees C.; and
cooling said container and recovering said titanium nitride whiskers from said container.

* * * * *